(12) United States Patent
Chung

(10) Patent No.: US 10,672,842 B2
(45) Date of Patent: Jun. 2, 2020

(54) ILLUMINATING PANEL AND LIGHTING DEVICE

(71) Applicant: BOE TECHNOLOGY GROUP CO., LTD., Beijing (CN)

(72) Inventor: Chiehhsing Chung, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/745,089

(22) PCT Filed: Aug. 11, 2017

(86) PCT No.: PCT/CN2017/097114
§ 371 (c)(1),
(2) Date: Jan. 15, 2018

(87) PCT Pub. No.: WO2018/033028
PCT Pub. Date: Feb. 22, 2018

(65) Prior Publication Data
US 2020/0083305 A1    Mar. 12, 2020

(30) Foreign Application Priority Data

Aug. 19, 2016  (CN) .......................... 2016 1 0697086

(51) Int. Cl.
*H01L 27/32*     (2006.01)
*H01L 27/15*     (2006.01)
(Continued)

(52) U.S. Cl.
CPC ........ *H01L 27/3237* (2013.01); *H01L 27/156* (2013.01); *H01L 27/3202* (2013.01);
(Continued)

(58) Field of Classification Search
None
See application file for complete search history.

(56) References Cited

U.S. PATENT DOCUMENTS 5,902,688 A    5/1999  Antoniadis
8,513,879 B2*  8/2013  Tamonoki ........... H01L 27/3272
                                                   313/505
(Continued)

FOREIGN PATENT DOCUMENTS

CN          204463091 U       7/2015

OTHER PUBLICATIONS

International Search Report and Written Opinion dated Nov. 16, 2017 in PCTCN2017097114.

*Primary Examiner* — J. E. Schoenholtz
(74) *Attorney, Agent, or Firm* — Syncoda LLC; Feng Ma

(57) ABSTRACT

An illuminating panel includes a light source layer comprising a plurality of light-emitting components, a conductive layer disposed over a light-emitting side of the light source layer, and an insulating layer sandwiched between the light source layer and the conductive layer. The conductive layer comprises signal lines, each configured to drive emission of lights from the light-emitting components, and further comprises a light-shielding portion, configured to block one portion of the lights from the light source layer from passing therethrough. The light-emitting components are configured such that those unshielded or partially shielded by the light-shielding portion is electrically coupled to one signal line to emit lights, and those completely shielded by light-shielding portion is not electrically coupled to the signal lines and thus not able to emit lights. A lighting device containing an illuminating panel is further disclosed herein.

18 Claims, 7 Drawing Sheets

(51) Int. Cl.
  *H01L 33/62* (2010.01)
  *H01L 33/42* (2010.01)
  *H01L 33/58* (2010.01)
  *H01L 51/00* (2006.01)
  *H01L 51/52* (2006.01)

(52) U.S. Cl.
  CPC .............. *H01L 33/42* (2013.01); *H01L 33/58* (2013.01); *H01L 33/62* (2013.01); *H01L 51/0097* (2013.01); *H01L 51/5203* (2013.01); *H01L 51/5284* (2013.01); *H01L 2251/308* (2013.01); *H01L 2251/5338* (2013.01); *H01L 2251/5361* (2013.01)

(56) References Cited

U.S. PATENT DOCUMENTS

| | | | | |
|---|---|---|---|---|
| 9,965,122 | B2* | 5/2018 | Kim | G02F 1/1345 |
| 10,103,178 | B2* | 10/2018 | Tada | H01L 27/124 |
| 10,483,334 | B1* | 11/2019 | Wu | H01L 27/3246 |
| 2014/0376257 | A1* | 12/2014 | Sawada | G06F 3/041 |
| | | | | 362/606 |
| 2017/0153753 | A1* | 6/2017 | Ishizaki | G06F 3/044 |
| 2018/0031939 | A1* | 2/2018 | Imazeki | G02F 1/13338 |

* cited by examiner

ILLUMINATING PANEL AND LIGHTING DEVICE

CROSS-REFERENCE TO RELATED APPLICATION

The present application claims priority to Chinese Patent Application No. 201610697086.7 filed on Aug. 19, 2016, the disclosure of which is hereby incorporated by reference in its entirety.

TECHNICAL FIELD

The present disclosure relates generally to the field of lighting technologies, and specifically to an illuminating panel and a lighting device.

BACKGROUND

As a type of current-driven lighting components, organic light-emitting diodes (OLEDs) have been more and more employed in flat lighting devices due to its advantageous features such as self-luminescence, fast response, wide viewing angles, and capability of being manufactured on flexible substrates.

SUMMARY

In order to improve current lighting technologies, the present disclosure provides an illuminating panel and a lighting device that contains the illuminating panel.

In a first aspect, an illuminating panel is disclosed. The illuminating panel includes a light source layer, a conductive layer, and an insulating layer. The light source layer comprises a plurality of light-emitting components; the conductive layer is disposed over a light-emitting side of the light source layer; and the insulating layer is sandwiched between the light source layer and the conductive layer.

In the illuminating panel, the conductive layer comprises at least one signal line and at least one light-shielding portion. Each of the at least one signal line is configured to provide a light-emitting signal to the plurality of light-emitting components to thereby drive emission of lights therefrom. The at least one light-shielding portion is configured to block one portion of the lights from the light source layer from passing therethrough.

In the illuminating panel, the plurality of light-emitting components in the light source layer can comprise a first subset of light-emitting components and a second subset of light-emitting components.

As for the first subset of light-emitting components, their orthographic projection on the insulating layer is completely outside, or partially overlapped with, an orthographic projection of the at least one light-shielding portion on the insulating layer. As for the second subset of light-emitting components, their orthographic projection on the insulating layer is completely inside an orthographic projection of the at least one light-shielding portion on the insulating layer.

According to some embodiments of the illuminating panel, each of the first subset of light-emitting components is electrically coupled to one of the at least one signal line, and is configured to emit a light upon receiving the light-emitting signal from, one of the at least one signal line. Each of the second subset of light-emitting components is not electrically coupled to the at least one signal line, and is thus configured not to emit a light.

In the illuminating panel as described above, each of the first subset of light-emitting components can be electrically coupled to the one of the at least one signal line through a via arranged in the insulating layer.

In the illuminating panel, each of the plurality of light-emitting components can comprise a first electrode, a light-emitting sub-layer, and a second electrode. Herein the first electrode is disposed over the conductive layer, the light-emitting sub-layer is disposed over the first electrode, and the second electrode is disposed over the light-emitting sub-layer.

Furthermore, it is configured such that least one of the first electrode or the second electrode of each of any two neighboring light-emitting components is insulated from one another.

In the illuminating panel as described above, as for each of the first subset of light-emitting components, the first electrode of each of the first subset of light-emitting components is electrically coupled to one of the at least one signal line through a via.

According to some embodiments of the illuminating panel, the first electrode of the each of the first subset of light-emitting components is electrically connected to the one of the at least one signal line directly through the via.

According to some other embodiments of the illuminating panel, the first electrode of the each of the first subset of the plurality of light-emitting components is electrically connected to the one of the at least one signal line through the via and a lead line, and the lead line is connected to the one of the at least one signal line.

According to some embodiments of the illuminating panel, as for any two neighboring light-emitting components, the first electrode in each of the two neighboring light-emitting components can be configured to be insulated from one another via a partitioning protrusion.

In the illuminating panel as described above, either one or both of the light-emitting sub-layer and the second electrode of each of any two neighboring light-emitting components can be further configured to be integrated from one another. In some preferred embodiments, the second electrode of the each of the plurality of light-emitting components is configured of be integrated from one another to thereby form an integrated structure.

Furthermore, in the illuminating panel as described above, the partitioning protrusion can be configured to be integrated with the insulating layer.

In the illuminating panel disclosed herein, the light-emitting sub-layer can comprise at least one of an organic light-emitting diode, a quantum dot light-emitting diode, or an microLED.

In the illuminating panel disclosed herein, the first electrode can have a composition of a transparent conductive material, which can be selected from at least one of indium tin oxide (ITO) or indium zinc oxide (IZO), and the second electrode can also have a composition of a transparent conductive material, which can be selected from at least one of indium tin oxide (ITO) or indium zinc oxide (IZO).

In the illuminating panel disclosed herein, the insulating layer can comprise a transparent insulating material.

The illuminating panel can further include a substrate, which can be selected from one of a glass substrate or a flexible substrate. The conductive layer can be disposed over the substrate.

According to some embodiments of the present disclosure, the illuminating panel further includes a packaging layer, which is disposed over a side of the light source layer opposing to the substrate.

In a second aspect, the present disclosure further provides a lighting device. The lighting device can include an illuminating panel according to any one of the embodiments as described above.

BRIEF DESCRIPTION OF DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

Figure 1:
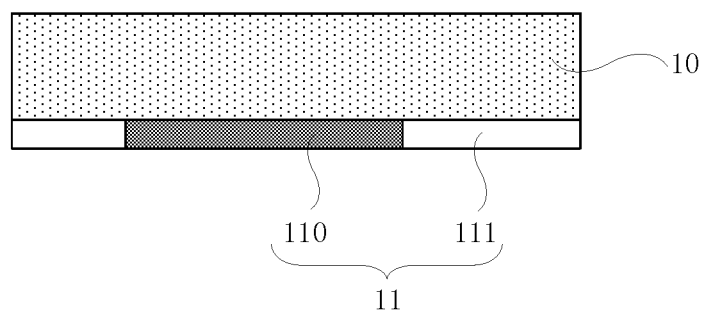
FIG. 1 is a diagram illustrating a lighting device in related technologies.

In existing lighting technologies, in order for a flat lighting device to realize certain decorative effects, as shown in FIG. 1, a decorating film 11 having a transparent region 110 and a light-blocking region 111 is typically arranged at a light-emitting side of an illuminating panel 10 in the flat lighting device.

Through different configurations of the shape and location of the transparent region 110 and the light-blocking region 111 in the decorating film 11, a certain decorative pattern can be formed. Lights emitted out from the illuminating panel 10 therefore have a pattern that substantially matches the aforementioned decorative pattern after the lights have passed through the decorating film 11.

In current technologies, however, the decorating film 11 and the illuminating panel 10 are two separate components manufactured independently through different manufacturing processes. As such, in the manufacturing process of a flat lighting device, an additional assembling process is required wherein the decorating film 11 is mounted to the light-emitting side of the illuminating panel 10, thereby causing increased thickness of the flat lighting device, increased manufacturing cost, increased energy consumption, and reduced degree of integration.

In light of the issues associated with existing lighting technologies as described above, the present disclosure provides an illuminating panel and a lighting device containing the illuminating panel.

In the following, with reference to the drawings of the embodiments disclosed herein, the technical solutions of the embodiments of the invention will be described in a clear and fully understandable way.

It is noted that the described embodiments are merely a portion but not all of the embodiments of the invention. Based on the described embodiments of the invention, those ordinarily skilled in the art can obtain other embodiment(s), which come(s) within the scope sought for protection by the invention.

In a first aspect, an illuminating panel is disclosed.

Figure 2:
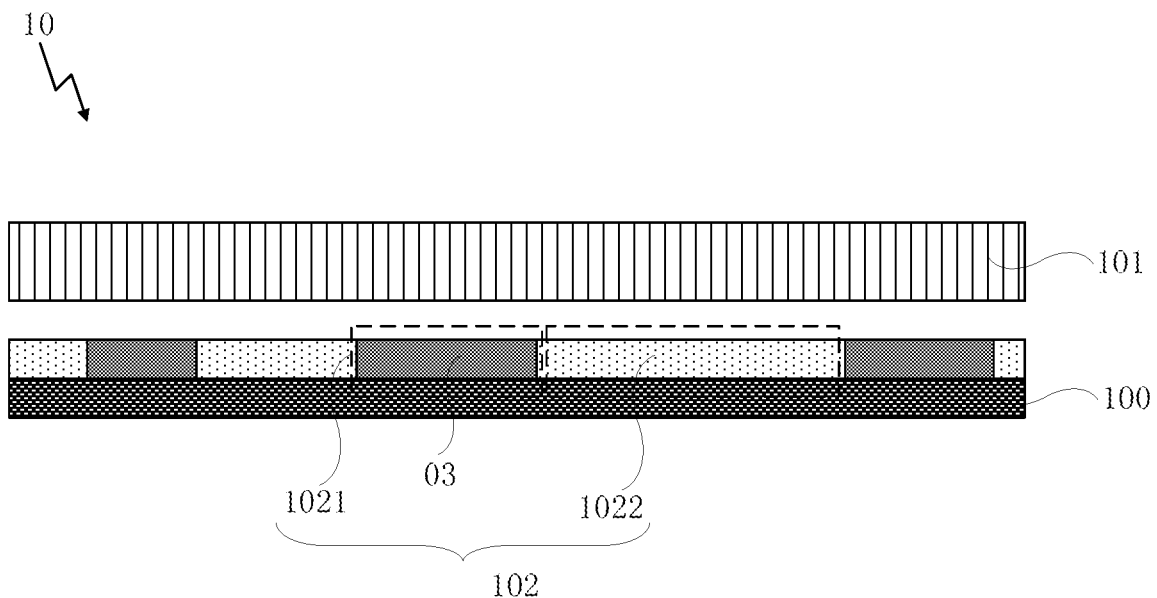
FIG. 2 is a diagram illustrating an illuminating panel provided by some embodiments of the present disclosure.

FIG. 2 shows an illuminating panel according to some embodiments of the present disclosure. As shown in FIG. 2, the illuminating panel 10 comprises a substrate 100 and a light source layer 101 that is disposed over the substrate 100.

A supplemental layer 102 is configured between the substrate 100 and the light source layer 101, and the supplemental layer 102 comprises a light-shielding portion 1021 and a transparent portion 1022.

In the supplemental layer 102, the light-shielding portion 1021 is configured to shield or block the light emitted from the light source layer 101, and the transparent portion 1022 is configured to allow the light emitted from the light source layer 101 to pass therethrough. Thus by configuring a supplemental layer 102 as described above, the light emitted from the light source layer 101 can be shaped to have a specific pattern.

In addition, because the supplemental layer 102 is located between the substrate 100 and the light source layer 101, the illuminating panel 10 thus has a functionality of light shaping by itself. As such, there is no need to assemble a decorating film over the illuminating panel as illustrated in FIG. 1, thereby avoiding the complex processes brought on by employing the decorating film, which in turn improves the degree of integration of the lighting device that contains the illuminating panel.

It is noted that because the transparent portion 1022 is configured to allow the light emitted from the light source layer 101 to pass therethrough, the transparent portion 1022 can comprise a transparent material. In addition, in order to avoid an influence of the transparent portion 1022 on the electrical properties of the illuminating panel 10, the transparent portion 1022 can comprise a transparent insulating material, such as a transparent resin material.

The light-shielding portion 1021 is configured to shield or block the light emitted from the light source layer 101. As such, the light-shielding portion 1021 can comprise a thin film layer.

In one embodiment as illustrated in FIG. 2, the light-shielding portion 1021 can include a first thin film layer 03. The first thin film layer 03 can comprise a light-blocking material, which can be, for example, a metal material or a black resin material.

Figure 3:
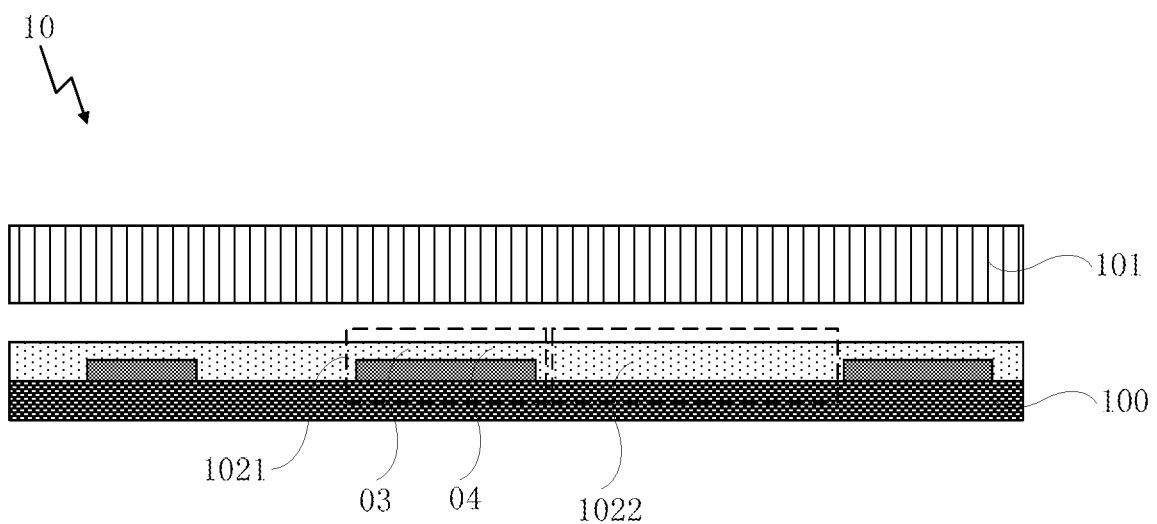
FIG. 3 is a diagram illustrating an illuminating panel provided by some other embodiments of the present disclosure.

Alternatively, the light-shielding portion 1021 can comprise two thin film layers, i.e., a first thin film layer 03 and a second thin film layer 04, as illustrated in FIG. 3. It can be configured such that the first thin film layer 03 comprises a light-blocking material, and the second thin film layer 04 comprises a transparent insulating material. Herein there is no limitation to the relative position of the first thin film layer 03 or the second thin film layer 04.

As such, the second thin film layer 03 can be arranged on a side of the first thin film layer 04 that is closer to or farther away from the substrate 100. The first thin film layer 03 and the second thin film layer 03 can be disposed over the substrate 100, and the second thin film layer 03 can be arranged above or below the first thin film layer 04.

Because the transparent portion 1022 comprises a transparent insulating material, and the second thin film layer 04 of the light-shielding portion 1021 also comprises a transparent insulating material, thus in some preferred embodiments, the second thin film layer 04 can be arranged above the first thin film layer 03 to thereby allow the transparent portion 1022 and the second thin film layer 04 to form an integrated structure.

As a result, when manufacturing the supplemental layer 102, the first thin film layer 03 can be first formed over the substrate 100 and patterned through a first patterning process. Subsequently, over the substrate 100 that has the first thin film layer 03 formed thereon, a transparent insulating material layer can be formed though a second patterning process, so that the second thin film layer 04 and the transparent portion 1022 can be formed at the same time.

In the present disclosure, each of the patterning processes as described above can include a photolithographic process, or include both a photolithographic process and an etching process. It should be also noted that each of the two patterning processes as described above (i.e., the first patterning process and the second patterning process) can also include other processes for forming a preselected pattern, such as a printing process, or an inkjet printing process.

In the above, the photolithographic process refers to a pattern formation process that includes a series of sub-processes such as film formation, exposure, and development, etc. These sub-processes may involve the use of photoresist, photomask and exposure device. Specific patterning processes can be selected based on practical needs and specific structures in the embodiments of the present disclosure.

In some embodiments disclosed herein, a one-time patterning process may be employed, which can be as follows: a one-time mask exposure process is first employed to form different exposure regions, and multiple removal processes such as etching and ashing, etc. are then conducted to the different exposure regions to thereby obtain the expected pattern. It is noted that a patterning process other than the one-time patterning process may also be employed. There are no limitations herein.

In the following, the light source layer 101 of the illuminating panel 10 as mentioned above will be described in detail with the following illustrating embodiments.

Figure 4:
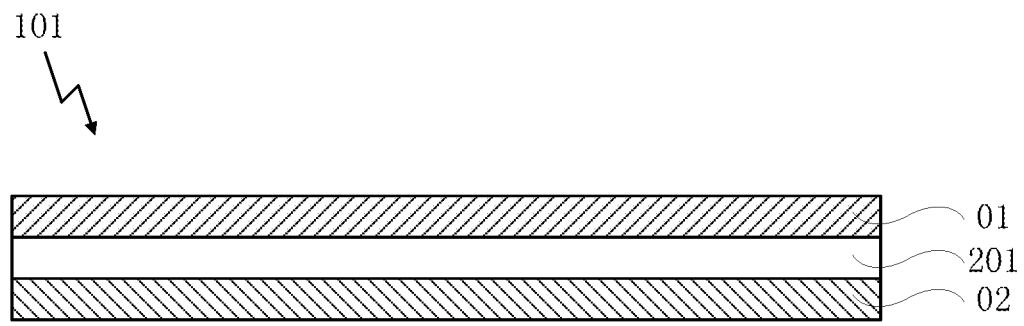
FIG. 4 illustrates a structural diagram of the light source layer as shown in FIG. 2 or FIG. 3.

In some embodiments of the illuminating panel, the light source layer 101 includes a first electrode plate 01, a second electrode plate 02, and a light-emitting sub-layer 201. The first electrode plate 01, the second electrode plate 02, and the light-emitting sub-layer 201 are each disposed over the substrate 100, and the light-emitting sub-layer 201 is sandwiched between the first electrode plate 01 and the second electrode plate 02, as illustrated in FIG. 4.

Herein, the light-emitting sub-layer 20 can have a composition of an organic light-emitting material or a quantum dot light-emitting material. The light-emitting sub-layer 20 is configured such that upon application of a voltage to the first electrode plate 01 and the second electrode plate 02, the light-emitting sub-layer 201 emits lights in the electric field formed by the first electrode plate 01 and the second electrode plate 02, to thereby provide a light source for the illuminating panel 10.

According to some embodiments of the illuminating panel, the light source layer 101 is pixelized.

Figure 5:
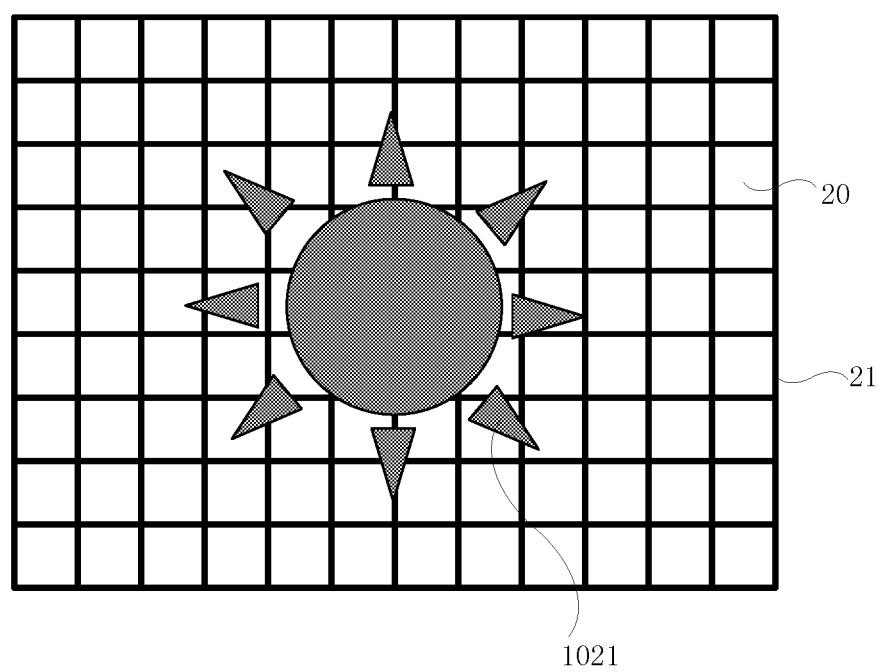
FIG. 5 illustrates a pixelized light source layer and a light-shielding portion in an illuminating panel according to some embodiment of the present disclosure.

Specifically, as illustrated in FIG. 5, the light source layer 101 further comprise a plurality of light-emitting components 20 (i.e. a plurality of light-emitting units, or pixel units) and a plurality of signal lines 21. The plurality of light-emitting components 20 are arranged in a matrix, and one or more of the plurality of signal lines 21 are arranged at a peripheral region of each of the plurality of light-emitting components 20, configured such that every two neighboring light-emitting components 20 is separated by a signal line 21, thereby realizing an independent control of the plurality of light-emitting components 20.

In order for the lights emitted by the light source layer 101 to pass through the transparent portion 1022 of the supplemental layer 102, it can be configured such that the light-emitting components 20 unshielded or unblocked by the light-shielding portion 1021 are coupled to the signal lines 21, so that the signal lines 21 can provide light-emitting signals to the light-emitting components 20 corresponding to the transparent portion 1022 to drive the light-emitting components 20 at these locations to emit lights, thereby lights emitted by the light source layer 101 can pass through the transparent portion 1022. As such, several embodiments are possible.

In some embodiments as illustrated in FIG. 5, it is configured such that in the light source layer 101, the signal lines 21 are only arranged at the peripheral regions of the light-emitting components 20 unshielded by the light-shielding portion 1021, but are not arranged at the peripheral regions of the light-emitting components 20 shielded by the light-shielding portion 1021.

As such, the light-emitting components 20 unshielded by the light-shielding portion 1021 are coupled to the signal lines 21, and the light-emitting components 20 shielded by the light-shielding portion 1021 are not coupled to the signal lines 21. Thereby only the light-emitting components 20 unshielded by the light-shielding portion 1021 (but not the light-emitting components 20 shielded by the light-shielding portion 1021) can receive light-emitting signals from the signal lines 21 to thereby emit lights.

Figure 6:
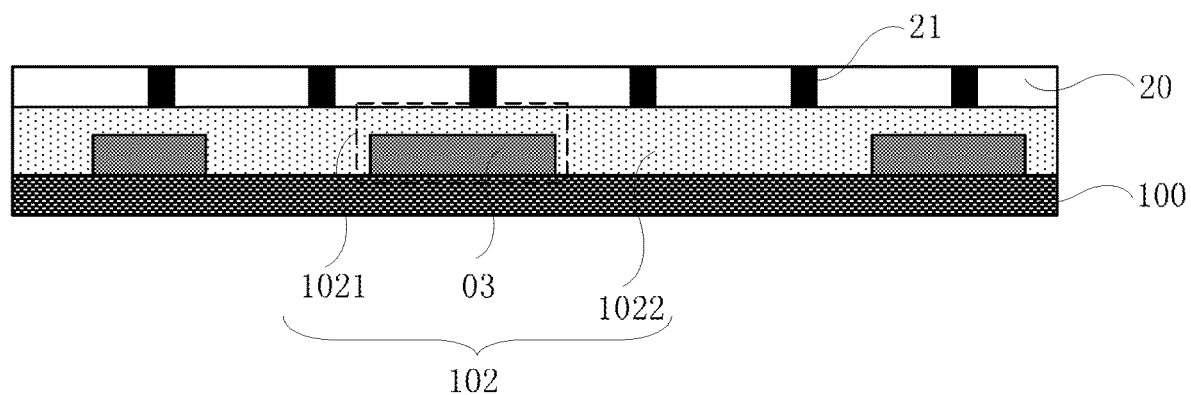
FIG. 6 is a structural diagram of the connections between the signal lines and the light-emitting components in the light source layer in the illuminating panel as shown in FIG. 5.

In some other embodiments of the illuminating panel as illustrated in FIG. 6, the signal lines 21 are arranged at a peripheral region of each of the plurality of light-emitting components 20 in the light source layer 101, and thus all light-emitting components 20, which include light-emitting components 20 shielded by the light-shielding portion 1021 and light-emitting components 20 unshielded by the light-shielding portion 1021, are coupled to the signal lines 21. As such, all light-emitting components 20 are able to emit lights upon receiving the light-emitting signal from the signal lines 21.

In the above embodiments of the illuminating panel 10 as illustrated in either FIG. 5 or FIG. 6, by pixelizing the light source layer 101 in only the region unshielded by the light-shielding portion 1021 of the supplemental layer 102 (as illustrated in FIG. 5) or in all the regions of the light source layer 101 (as illustrated in FIG. 6), each of the light-emitting components 20 in the light source layer 101 can be separately controlled through the signal lines 21 at its own peripheral regions.

As such, if any light-emitting components 20 of the light source layer 101 are damaged due to environmental factors (for example, impure substance, dust) or human factors during manufacturing or during usage, the remaining light-emitting components 20 that are not damaged can still receive light-emitting signals from the signal lines 21 coupled thereto to emit light normally.

It is noted that compared with the aforementioned illuminating panel 101 having a pixelized light source layer 101, in an illuminating panel 101 where the light source layer 101 therein is not pixelized (such as that illustrated in FIG. 4), if any portion of the light source layer 101 is damaged during manufacturing or during usage, the whole illuminating panel 10 would not be able to function normally. Therefore, the illuminating panel 101 having a pixelized light source layer 101 has an advantage of high reliability.

Herein the light-emitting components 20 corresponding to the transparent portion 1022 are referred to as the light-emitting components 20 whose orthographic projection on the substrate 100 is located within a region formed by an orthographic projection of the transparent portion 1022 on the substrate 100.

Herein the light-emitting components 20 unshielded or unblocked by the light-shielding portion 1021 are referred to as the light-emitting components 20 whose orthographic projection on the substrate 100 is located outside a region formed by an orthographic projection of the light-shielding portion 1021 on the substrate 100.

Herein the light-emitting components 20 shielded or blocked by the light-shielding portion 1021 are referred to as the light-emitting components 20 whose orthographic projection on the substrate 100 at least overlaps with the region formed by an orthographic projection of the light-shielding portion 1021 on the substrate 100.

Figure 7:
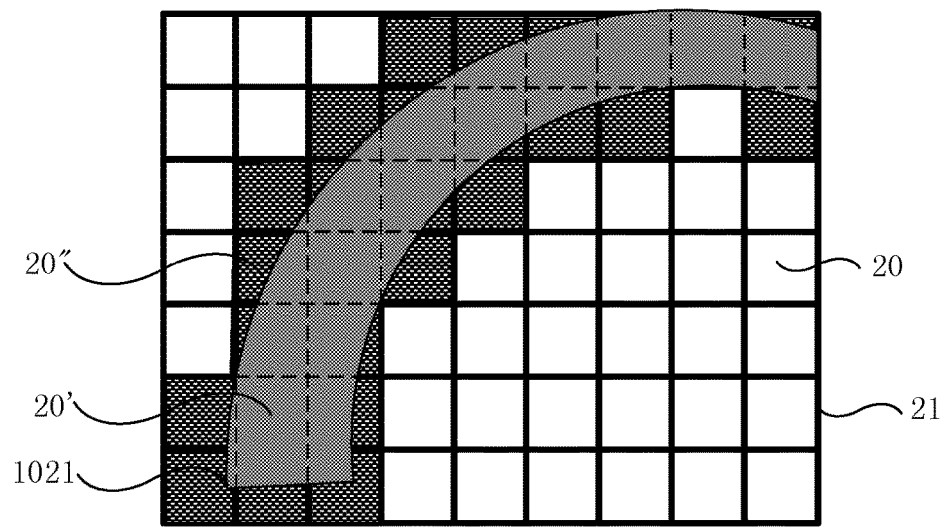
FIG. 7 illustrates a pixelized light source layer and a light-shielding portion in an illuminating panel according to another embodiment of the present disclosure.

Depending on the extent of shielding by the light-shielding portion 1021, the light-emitting components 20 shielded or blocked by the light-shielding portion 1021 can comprise light-emitting components 20' completely shielded by the light-shielding portion 1021, and light-emitting components 20" partially shielded by the light-shielding portion 1021, as illustrated in FIG. 7.

If only the light-emitting components 20 unshielded or unblocked by the light-shielding portion 1021 are coupled to the signal lines 21 to thus emit lights upon receiving light-emitting signals from the signal lines 21 (i.e. the light-emitting components 20' completely shielded by the light-shielding portion 1021 and the light-emitting components 20" partially shielded by the light-shielding portion 1021 are not coupled to the signal lines 21 and are thus not able to emit lights), the edge of the light-shielding portion 2021 appears to be in a zigzag pattern, as shown in FIG. 7, which reduces the aesthetics of the illuminating pattern.

Figure 8:
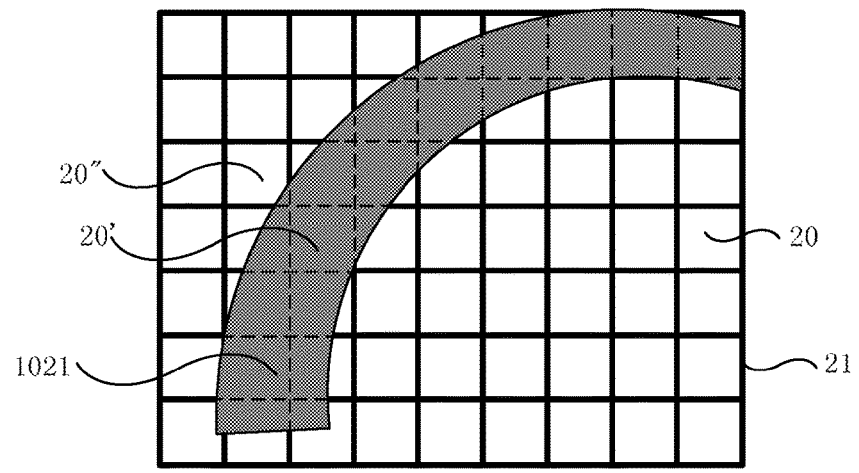
FIG. 8 illustrates a pixelized light source layer and a light-shielding portion in an illuminating panel according to yet another embodiment of the present disclosure.

In order to solve the issue as described above, the light source layer 101 can be configured such that the light-emitting components 20 unshielded by the light-shielding portion 1021 and the light-emitting components 20" partially shielded by the light-shielding portion 1021 are electrically coupled to the signal lines 21, and are thereby able to emit light upon receiving light-emitting signals therefrom, whereas the light-emitting components 20' completely shielded by the light-shielding portion 1021 are not electrically coupled to the signal lines 21, and are thereby unable to emit lights, as shown in FIG. 8.

Herein, for convenience in reference, the light-emitting components 20 unshielded by the light-shielding portion 1021 and the light-emitting components 20" partially shielded by the light-shielding portion 1021 are collectively called a first subset of light-emitting components, whereas the light-emitting components 20' completely shielded by the light-shielding portion 1021 are called a second subset of light-emitting components.

As such, because the light-emitting components 20" that are partially shielded or blocked by the light-shielding portion 1021 can also receive the light-emitting signals from the signal lines 21 and are thus able to emit lights, the edge of the light-shielding portion 1021 becomes smooth, thereby improving the aesthetics of the illuminating pattern.

In another aspect, because the light-emitting components 20' that are completely shielded or blocked by the light-shielding portion 1021 are not electrically coupled to the signal lines 21, and thereby do not emit lights, it can reduce power consumption compared with an illuminating panel where all light-emitting components 20 are configured to emit lights.

It is noted that there are multiple manners to control whether a specific light-emitting component, including one that is unshielded by the light-shielding portion 1021 (i.e. the light-emitting component 20), one that is completely shielded by the light-shielding portion 1021 (i.e. the light-emitting component 20'), and one that is partially shielded by the light-shielding portion 1021 (i.e. the light-emitting component 20"), is electrically coupled to the signal lines 21 to thereby emit lights.

In one of such manners, a via can be arranged between a light-emitting component and a signal line to thereby provide a means for electrical coupling or connection between the light-emitting component and the signal line. Several embodiments are possible.

In one embodiment, a via is arranged between each of a first subset of light-emitting components and a signal line, if the first subset of light-emitting components are to be unshielded (i.e. 20) or partially shielded (i.e. 20'), whereas no via is arranged between each of a second subset of light-emitting components and a signal line, if the second subset of light-emitting components are to be completely shielded (i.e. 20").

In yet another embodiment, a via is arranged between each light-emitting components and a signal line during a manufacturing process of the illuminating panel. For the second subset of light-emitting components are to be completely shielded (i.e. 20"), the vias corresponding thereto are removed in a subsequent manufacturing process, whereas for the first subset of light-emitting components that are to be unshielded (i.e. 20) or partially shielded (i.e. 20'), the vias corresponding thereto are retained and filled with a conducting material to provide a means for electrical coupling or connection between the first subset of the light-emitting components and the signal lines.

It is noted that in any of the above two manners, if the light-emitting components to be partially shielded are small, vias do not need to be arranged for these light-emitting components, or the vias arranged for these light-emitting components can be removed; such configuration is unlikely to cause a notable impact on the illuminating/lighting effect.

These above manners utilizing vias for arranging the electrical coupling between each light-emitting component and the signal lines will be described below in detail.

In the following, the structures of some parts in the illuminating panel 10, such as the light-shielding portion 1021, will be described in detail with embodiments having a pixelized light source layer 101 as illustrating examples.

The structure of the light-shielding portion 1021 is described as follows.

Figure 9:
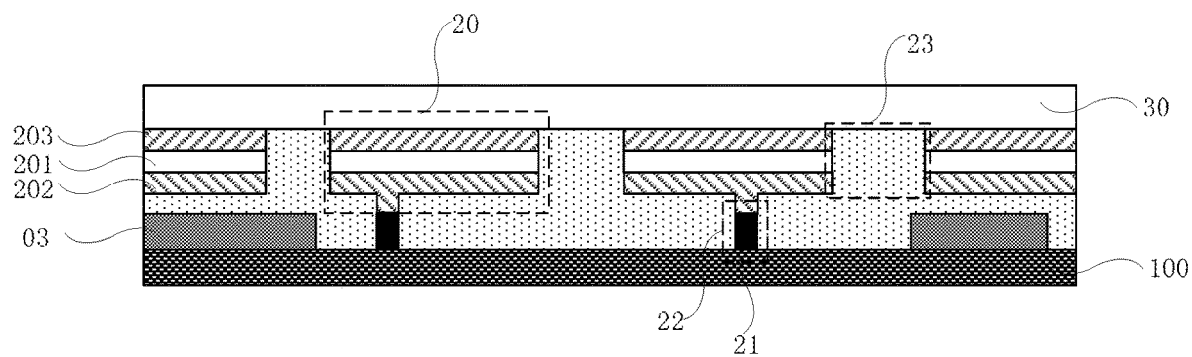
FIG. 9 is a structural diagram of an illuminating panel provided by some embodiment of the present disclosure.
Figure 10:
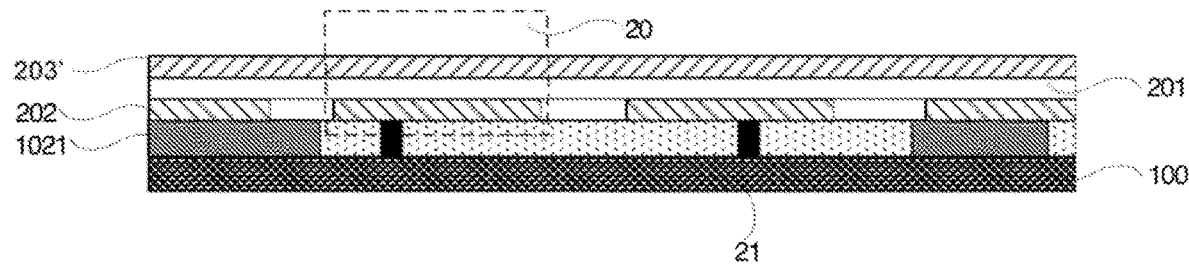
FIG. 10 is a structural diagram of an illuminating panel provided by another embodiment of the present disclosure.

Because the first thin film layer 03 employed to form the light-shielding portion 1021 can comprise a metal material, and the signal lines 21 can also be formed with a metal material, thus in order to simplify the manufacturing process, the first thin film layer 03 and the signal lines 21 can be configured to be on a substantially same layer and comprise a substantially same material, as illustrated in FIG. 9 or FIG. 10. Herein the first thin film layer 03 and the signal lines 21 can be regarded as in a same conductive layer in the illuminating panel disclosed herein.

As such, during a patterning process to manufacture the first thin film layer 03 over the substrate 100, the signal lines 21 can be formed at the same time as the signal lines 21.

The light-shielding portion 1021 can be further coupled to the signal lines 21. As such, the light-shielding portion 1021 as shown in FIG. 5 and the signal lines 21 can have an integrated structure. Thus when manufacturing the signal lines 21, the directions of the signal lines 21 at the locations of the light-shielding portion 1021 do not need to be changed to leave space for the light-shielding portion 1021. Consequently, the manufacturing process can be simplified, and the shapes of the regions where the light-emitting components 20 are located do not need to be changed.

FIG. 9 illustrates the structure of the light-emitting components 20 of an illuminating panel according to some embodiments of the present disclosure. As shown in FIG. 9, each light-emitting component 20 comprises a first electrode 202, a light-emitting sub-layer 201, and a second electrode 203, disposed consecutively over the substrate (i.e., disposed in an order from closest from the substrate 100 to farthest from the substrate 100).

The first electrodes 202 of every two neighboring light-emitting components 20 are configured to be insulated from each other. The first electrode 202 can be a transparent electrode, thereby allowing the light emitted from the light-emitting sub-layer 201 to pass therethrough before emitting out. According to some embodiments, the first electrode 202 can comprise a transparent conductive material, such as indium tin oxide (ITO), and indium zinc oxide (IZO).

On the above basis, in order for the light-emitting components 20 to be able to receive light-emitting signals from the signal lines 21 to thereby emit lights, a plurality of vias 22 can be arranged in the supplemental layer 102 to allow an electrical coupling (or electrical connection) between the light-emitting components 20 and the signal lines 21.

For example, vias 22 can be arranged in the transparent insulating material of the transparent portion 1022 of the supplemental layer 102 to thereby electrically couple or connect the first electrodes 202 with the signal lines 21 therethrough, as illustrated in FIG. 9.

In the light-emitting components 20 of the illuminating panel as shown in FIG. 9, the second electrodes 203 in the light-emitting components 20 are separated from one another, just like the first electrodes 202. It is noted that the second electrodes 203 in the light-emitting component 20 do not need to be separated from one another, and can also form an integrated structure.

FIG. 10 illustrates the structure of the light-emitting components 20 of an illuminating panel according to some other embodiments of the present disclosure. As shown in FIG. 10, in addition to a plurality of first electrodes 202 that are separated from one another and a light-emitting sub-layer 201 disposed over the plurality of first electrodes 202, the illuminating panel further comprises an integrated second electrode 203', which is disposed over the light-emitting sub-layer 201.

As such, each first electrode 202, a portion of the light-emitting sub-layer 201 corresponding thereto, and a portion of the integrated second electrode 203' corresponding thereto substantially form a light-emitting component 20. If a light-emitting signal is provided to the integrated second electrode 203, the light-emitting signal can also be received by each of the light-emitting components 20 of the illuminating panel.

It is further noted that in addition to this above embodiment of the illuminating panel where each light-emitting component 20 shares one signal integrated second electrode 203 (as illustrated in FIG. 10), the illuminating panel can be configured such that the light-emitting sub-layer 202 or the second electrodes 203 of at least one pair of two neighboring light-emitting components 20 can be configured to be integrated. There are no limitations herein.

It is noted that in the embodiments of the illuminating panel as shown in FIG. 9 where a plurality of separated second electrodes 203 are employed, each second electrode 203 can be electrically coupled or connected to different signal lines respectively. As such the light-emitting signals can be also received by the different second electrode 203 from the different signal lines.

It should be noted that if the light-emitting components 20 are needed to only emit light to the side closer to the substrate 100, the plurality of second electrodes 203 in the embodiments of the illuminating panel as illustrated in FIG. 9, and the integrated second electrode 203' in the embodiments of the illuminating panel as illustrated in FIG. 10 as well, can be configured to comprise a metal material.

If, however, it is favored that the light-emitting components 20 are needed to emit lights to both sides of the substrate 100, the plurality of second electrodes 203 or the integrated second electrode 203' can be configured to comprise a transparent conductive material. There are no limitations herein.

Regardless of the above two embodiments of the illuminating panel (either having a plurality of second electrodes 203 or having an integrated second electrode 203'), the first electrodes 202 of every two neighboring light-emitting components 20 are configured to be insulated from one another.

In order for the first electrodes 202 of every two neighboring light-emitting components 20 to be insulated from one another, in some embodiments of the illuminating panel 10 as shown in FIG. 9, a partitioning protrusion 23 can be arranged between the every two neighboring light-emitting components 20. As such, the light-emitting sub-layers 201 of the every two neighboring light-emitting components 20 can be insulated from one another though a plurality of partitioning protrusion 23.

Furthermore, because each of the plurality of partitioning protrusions 23 comprises an insulating material, and the transparent portion 1022 also comprises transparent insulating material, in order to simply the manufacturing process, according to some embodiments of the illuminating panel, the plurality of partitioning protrusions 23 and the transparent portion 1022 can have an integrated structure (i.e. the plurality of partitioning protrusions 23 and the transparent portion 1022 can have a same composition of a transparent insulating material).

Specifically, a method for manufacturing an illuminating panel 10 can be as follows:

First, forming a transparent insulating material layer over the substrate having light-shielding portions 1021 and signal lines 21 disposed thereover;

Then, forming partitioning protrusions 23 and transparent portions 1022 on the transparent insulating material layer through a patterning process;

Next, forming vias 22 at locations on the transparent insulating material layer that corresponds to each signal line 21 and between every two neighboring partitioning protrusions 23;

Finally, forming first electrodes 202, light-emitting sub-layers 201, and second electrodes 203 between every two neighboring partitioning protrusions 23, wherein the first electrodes 202 are connected to the signal lines 21 through the vias 22.

In the manufacturing method the described above, the partitioning protrusions 23 and the transparent portions 1022 can be formed through a one-time patterning process, which can simplify the manufacturing process of the illuminating panel 10.

Figure 11:
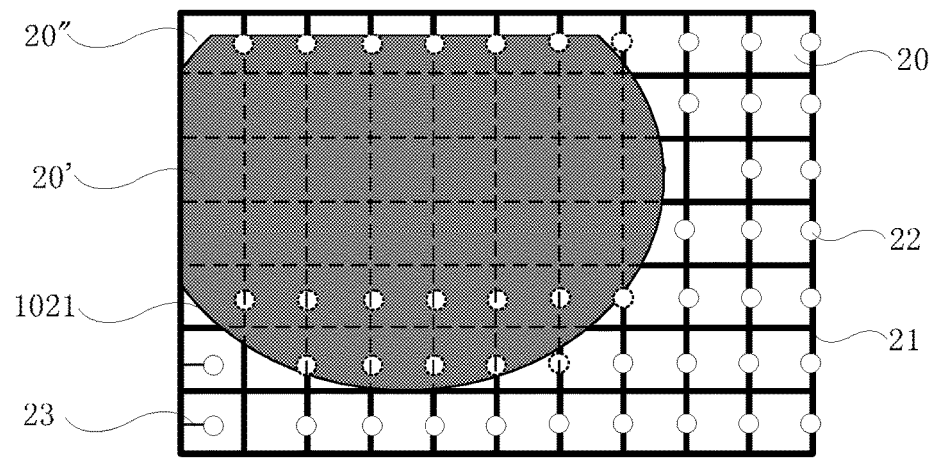
FIG. 11 is a diagram illustrating the configuration of the vias as shown in FIG. 9 and FIG. 10.

In one embodiment as shown in FIG. 11, the vias 22 can be formed at locations of the supplemental layer 102 that correspond to the signal lines 21. As such, the first electrodes 202 of the light-emitting components 20 can be connected directly to the signal lines 21 through the vias 22.

Figure 12:
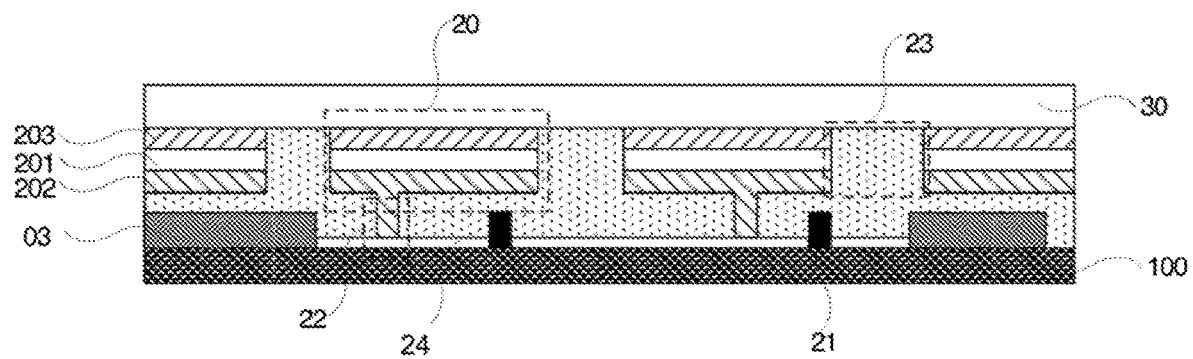
FIG. 12 is a structural diagram of an illuminating panel provided by yet another embodiment of the present disclosure.

In another embodiment as shown in FIG. 12, the vias 22 are formed at the locations of the supplemental layer 102 that correspond to each light-emitting component 20, and the first electrode 202 of the each light-emitting components 20 is connected to a lead line 24 through the vias 22. The lead line 24 is disposed between the supplemental layer 102 and the substrate 100, and is electrically connected to the signal lines 21.

As such, the first electrodes 202 and the signal lines 21 can be electrically connected through the lead lines 24 and the vias 22. In order to ensure that the amount of light emitted out by the light-emitting components 20 is not influenced, the lead lines 24 can comprises a transparent conductive material.

It can be known from the above descriptions that as long as the first electrodes 202 of different light-emitting components 20 are configured to be insulated from one another, independent control of the light-emitting components can be realized.

On this above basis, in order to simplify the manufacturing process, at least one of the light-emitting sub-layer 202 or the second electrodes 203 of each two neighboring light-emitting components 20 can be configured to be integrated.

Specifically, in some embodiments of the illuminating panel 10, the light-emitting sub-layer 202 of each two neighboring light-emitting components 20 can be an integrated structure.

In some other embodiments of the illuminating panel 10, the second electrodes 203 of each two neighboring light-emitting components 20 can be an integrated structure.

In yet some other embodiments of the illuminating panel 10 as shown in FIG. 10, the light-emitting sub-layers 202 and the second electrodes 203 of two neighboring light-emitting components 20 have an integrated structure respectively. As such, there is no need to separately manufacture the second electrode 203 and/or light-emitting sub-layer 202 of each of the light-emitting components 20.

According to some embodiments, the light-emitting sub-layer 202 can comprise an organic light-emitting sub-layer, and accordingly, the light-emitting components 20 equipped with the light-emitting sub-layer 202 are organic light emitting diodes (OLED).

According to some other embodiments, the light-emitting sub-layer 202 can comprise a quantum dot light-emitting sub-layer, and accordingly, the light-emitting components 20 equipped with the light-emitting sub-layer 202 are quantum dot emitting diodes (QDED).

According to yet some other embodiments, the light-emitting sub-layer 202 can comprise a plurality of micro light emitting diodes (microLEDs).

In addition to the OLEDs, QDEDs, and microLEDs, the light-emitting sub-layer 202 can have other light-emitting structures, and there are no limitations herein.

It is further noted that in any of the embodiments of the illuminating panel as described above, the substrate 100 can comprise a rigid substrate, such as a glass substrate, or can comprise a flexible substrate. There are no limitation herein.

Furthermore, in order to avoid the influence by the environmental factors such as dust or steam to the light source layer 101 which comprises light-emitting components 20, in some embodiments of the illuminating panel 10 as shown in FIG. 9, a packaging layer 30 is arranged at a side of the light source layer 101 opposite to the substrate 100.

The packaging layer 30 is configured to at least cover the side of the light source layer 101 that is opposite to the substrate 100. In addition, in order to improve the effect of packaging, the packaging layer 30 can be further configured to cover the sides of other layered structures in addition to the substrate 100.

It should be noted that the packaging layer 30 can be a thin film layer, or can be a shell structure having a composition of a material that is relatively hard.

In addition, if the light-emitting side of the illuminating panel 10 is a side thereof that is close to the substrate 100, the packaging layer 30 can have a composition of an opaque material. If the light-emitting side of the illuminating panel 10 is the sides thereof that are both close to and far away from the two sides of the substrate 100, the packaging layer 30 can be made with a transparent material. There are no limitations herein.

In another aspect, the present disclosure further provides a lighting device, which comprises an illuminating panel 10 according to any one of the embodiments as described above.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An illuminating panel, comprising:
a light source layer comprising a plurality of light-emitting components;
a conductive layer, disposed over a light-emitting side of the light source layer; and
an insulating layer, sandwiched between the light source layer and the conductive layer;
wherein:
the conductive layer comprises:
at least one signal line, each configured to provide a light-emitting signal to the plurality of light-emitting components to thereby drive emission of lights therefrom; and at least one light-shielding portion, configured to block one portion of the lights from the light source layer from passing therethrough.

2. The illuminating panel of claim 1, wherein:

each of a first subset of the plurality of light-emitting components whose orthographic projection on the insulating layer is completely outside, or partially overlapped with, an orthographic projection of the at least one light-shielding portion on the insulating layer is electrically coupled to, and configured to emit a light upon receiving the light-emitting signal from, one of the at least one signal line; and each of a second subset of the plurality of light-emitting components whose orthographic projection on the insulating layer is completely inside an orthographic projection of the at least one light-shielding portion on the insulating layer is not electrically coupled to the at least one signal line.

3. The illuminating panel of claim 2, wherein the each of the first subset of the plurality of light-emitting components is electrically coupled to the one of the at least one signal line through a via arranged in the insulating layer.

4. The illuminating panel of claim 1, wherein each of the plurality of light-emitting components comprises:

a first electrode, disposed over the conductive layer;
a light-emitting sub-layer, disposed over the first electrode; and
a second electrode, disposed over the light-emitting sub-layer;
wherein:
at least one of the first electrode or the second electrode of each of any two neighboring light-emitting components is insulated from one another.

5. The illuminating panel of claim 4, wherein as for each of a first subset of the plurality of light-emitting components whose orthographic projection on the insulating layer is completely outside, or partially overlapped with, an orthographic projection of the at least one light-shielding portion on the insulating layer:

the first electrode of the each of the first subset of the plurality of light-emitting components is electrically coupled to one of the at least one signal line through a via.

6. The illuminating panel of claim 5, wherein the first electrode of the each of the first subset of the plurality of light-emitting components is electrically connected to the one of the at least one signal line directly through the via.

7. The illuminating panel of claim 5, wherein the first electrode of the each of the first subset of the plurality of light-emitting components is electrically connected to the one of the at least one signal line through the via and a lead line, wherein the lead line is connected to the one of the at least one signal line.

8. The illuminating panel of claim 4, wherein the first electrode of the each of any two neighboring light-emitting components is insulated from one another via a partitioning protrusion.

9. The illuminating panel of claim 8, wherein at least one of the light-emitting sub-layer or the second electrode of the each of any two neighboring light-emitting components is integrated from one another.

10. The illuminating panel of claim 9, wherein the second electrode of the each of the plurality of light-emitting components is integrated from one another to thereby form an integrated structure.

11. The illuminating panel of claim 8, wherein the partitioning protrusion is integrated with the insulating layer.

12. The illuminating panel of claim 4, wherein the light-emitting sub-layer comprises at least one of an organic light-emitting diode, a quantum dot light-emitting diode, or an microLED.

13. The illuminating panel of claim 4, wherein the first electrode comprises a transparent conductive material, selected from at least one of indium tin oxide (ITO) or indium zinc oxide (IZO).

14. The illuminating panel of claim 13, wherein the second electrode comprises a transparent conductive material, selected from at least one of indium tin oxide (ITO) or indium zinc oxide (IZO).

15. The illuminating panel of claim 1, wherein the insulating layer comprises a transparent insulating material.

16. The illuminating panel of claim 1, further comprising a substrate, wherein the conductive layer is disposed over the substrate, and the substrate is a glass substrate, or a flexible substrate.

17. The illuminating panel of claim 1, further comprising a packaging layer, disposed over a side of the light source layer opposing to the substrate.

18. A lighting device, comprising an illuminating panel according to claim 1.

* * * * *